(12) United States Patent
Kurihara

(10) Patent No.: US 6,272,323 B1
(45) Date of Patent: Aug. 7, 2001

(54) AUTOMATIC GAIN CONTROL AMPLIFIER CONTROL CIRCUIT

(75) Inventor: Kazuhiro Kurihara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/208,134

(22) Filed: Dec. 9, 1998

(30) Foreign Application Priority Data

Dec. 10, 1997 (JP) ...................................................... 9-339823

(51) Int. Cl.$^7$ ................................. H04B 1/40; H03G 3/30
(52) U.S. Cl. ........................... 455/73; 455/84; 455/245.1; 455/251.1; 330/284
(58) Field of Search .............................. 455/73, 84, 115, 455/126, 127, 234.1, 234.2, 245.1, 251.1, 78–80; 330/278, 279, 280, 284, 129; 333/81 R; 375/345

(56) References Cited

U.S. PATENT DOCUMENTS 4,518,927 * 5/1985 Koppe et al. ......................... 330/284

FOREIGN PATENT DOCUMENTS

| | | |
|---|---|---|
| 60-227574 | 11/1985 | (JP) . |
| 2-68516 | 5/1990 | (JP) . |
| 6-90124 | 3/1994 | (JP) . |
| 7-33024 | 6/1995 | (JP) . |
| 7-193445 | 7/1995 | (JP) . |
| 8-330872 | 12/1996 | (JP) . |
| 9-27723 | 1/1997 | (JP) . |

\* cited by examiner

*Primary Examiner*—Lester G. Kincaid
(74) *Attorney, Agent, or Firm*—Scully, Scott, Murphy & Presser

(57) ABSTRACT

An AGC amplifier control circuit applying for both transmission and reception which the quantity of data memorizing in a memory is decreased and the address of the memory is simplified is provided. The AGC amplifier control circuit provides RF attenuators controlled in hysteresis and these RF attenuators are driven at the next gain renewing time of AGC amplifiers and provides attenuation controllers outputting the information whether the RF attenuators have a fixed attenuation quantity or not. In this construction of circuit, memories memorize the control voltage data of the gain of the AGC amplifiers with the relation of desired outputs, at the time when the RF attenuators are driven and have a fixed attenuation quantity, data conversion circuits convert the data to make the gain of the AGC amplifiers increase corresponding to these attenuation quantities. Therefore, to the address of the memories, by using the value which the transmitting level or the receiving level is converted in consideration of the attenuation quantity of attenuators, the quantity of the data memorizing in the memories are saved in small and the quantity of the data is able to be reduced.

7 Claims, 6 Drawing Sheets

(a)

(b)

(c)

AUTOMATIC GAIN CONTROL AMPLIFIER CONTROL CIRCUIT

BACKGROUND OF THE INVENTION

The present invention relates to an automatic gain control amplifier control circuit which in particular implements level adjustment with a step attenuator in a transmitter or a receiver. Hereinafter automatic gain control is referred to as AGC.

DESCRIPTION OF THE RELATED ART

In a transmitter or a receiver, for example the conventional AGC amplifier control circuit is used to adjust the transmitting or receiving power with a step attenuator disposed at near an antenna.

FIG. 1 is a block diagram showing an example of the conventional AGC amplifier control circuit. In FIG. 1, a transmitting attenuator TX ATT 121 and a receiving attenuator RX ATT 110 are step attenuators providing a selective function which makes radio frequency RF signals pass as they are (off state) or makes only a certain quantity of the signals attenuate (on state).

A TX ATT controller 140 and a RX ATT controller 130 control to be that the attenuation characteristic of the transmitting attenuator TX ATT 121 and the receiving attenuator RX ATT 110 is hysteresis characteristic for a transmitting or received level at a terminal of an antenna respectively. A transmitting AGC amplifier TX AGC 124 and a receiving AGC amplifier RX AGC 113 adjust the gain of the transmitting or receiving IF (intermediate frequency) signal power. A TX memory 127 or a RX memory 116 memorizes the control voltage data of the transmitting AGC amplifier TX AGC 124 or the receiving AGC amplifier RX AGC 113 corresponding to the transmitting or receiving level about respective state of on/off of the transmitting or receiving attenuator. A transmitting digital to analog converter TX D/A 126 or a receiving digital to analog converter RX D/A 115 converts the control voltage of the transmitting AGC amplifier TX AGC 124 or the receiving AGC amplifier RX AGC 113 digital to analog and outputs the voltage, and controls the gain of the transmitting AGC amplifier TX AGC 124 or the receiving AGC amplifier RX AGC 113.

At the case of the characteristic between the gain and the control voltage $V_{cnt}$ of the AGC amplifier is not linear as shown in FIG. 2, for desired transmitting level or receiving level at a terminal of an antenna, the gain of the AGC amplifier is controlled to be linear as shown in FIGS. 3 and 4. To achieve this, the characteristic between the transmitting level and the transmitting control voltage $V_{tx}$ shown in FIG. 5, and the characteristic between the receiving level and the receiving control voltage $V_{rx}$ shown in FIG. 6 are needed. In the TX memory 127, the control voltage data shown in FIG. 5 are memorized and in the RX memory 116, the control voltage data shown in FIG. 6 are memorized. At the time when the data expressing transmitting or receiving level are inputted as addresses, designated transmitting or receiving control voltage data are outputted. In this, the unit of the transmitting level, the receiving level and the gain of the transmitting and receiving AGC amplifier is "dB".

Next, the operation of an example of the conventional AGC amplifier control circuit is explained. FIG. 7 is a diagram showing data conversion of the transmitter and FIG. 8 is a diagram showing data conversion of the receiver of the present invention. However, in this explanation, FIGS. 7 and 8 of the present invention are also used.

First, the transmitter is explained. The TX ATT controller 140 controls the transmitting attenuator TX ATT 121 in hysteresis for the transmitting level as shown in FIG. 7 (a). The reason why the transmitting attenuator TX ATT 121 is controlled in hysteresis is not to make the turning of on/off occur continuously, that is, to prevent the chattering from occurring, at the case that the transmitting level is stayed at near level of the turning on/off of the TX ATT 121. At the time that transmitting level is small, to improve a noise figure NF the TX ATT 121 is turned on and the attenuation is implemented. In FIG. 7 (a), the TX ATT 121 is in the state of "off" and the transmitting level becomes smaller than the point "A", the TX ATT 121 is turned "on" and from this state the transmitting level becomes bigger than the point "B", the TX ATT 121 is again turned "off" and the RF signals are passed without attenuation.

At the points "A" and "B" which the TX ATT 121 turns on/off, not to make the transmitting level at the terminal of the antenna change discontinuously, the TX AGC 124 must change the gain by the same quantity of the attenuation of the TX ATT 121 to the reverse direction. In FIG. 7 (b) shows the relation between the transmitting level and the gain of the TX AGC 124. The TX AGC 124 has the gains corresponding to the "on" and "off" state of the TX ATT 121 for the transmitting level respectively and has two kinds of gains between the points "A" and "B" of the transmitting level. Therefore, the TX memory 127 has the memory of the control voltage data for the respective "on" and "off" state of the TX ATT 121 at the transmitting level is between the points "A" and "B".

Next, the receiver is explained. The RX ATT controller 130 controls the RX ATT 110 in hysteresis for the receiving level as shown in FIG. 8 (a). At the case that the receiving level is large, for an intermodulation IM measure and so forth, the attenuation is implemented by turning on the RX ATT 110, and at the case that the receiving level is small, the RF signals are passed through as they are, not to make the attenuation implement. In FIG. 8 (a), the RX ATT 110 is in the state of "off" and the receiving level becomes larger than the point "B", the RX ATT 110 turns on. From this state, by the receiving level becomes smaller than the point "A", the RX ATT 110 turns again off and the RF signals are not attenuated and passed through.

At the points "A" and "B" which the RX ATT 110 turns "off" and "on", not to make an input level of a demodulator DEM 114 change discontinuously, the RX AGC 113 must change the gain by the same attenuation quantity of the RX ATT 110 to the reverse direction. FIG. 8 (b) shows the relation between the receiving level and the gain of the RX AGC 113. The unit of the receiving level and the gain of the RX AGC 113 is "dB" and to make the input level of the demodulator DEM 114 a fixed level, the control voltage data are generated to make the gradient "−1".

The RX AGC 113 has the gains corresponding to the state of "on" and "off" of the RX ATT 110 respectively for the receiving level and has two kinds of gains between the point "A" and "B" of the receiving level. Therefore the RX memory 116 has the memory of the control voltage data for the respective state of "on" and "off" of the RX ATT 110 at the receiving level between the point "A" and "B".

The Japanese Patent Laid-Open Publication No. SHO 60-227574 discloses the amplifier for the community television. This amplifier for the community television makes the operational level of the AGC circuit change in step wise and also displays whether the AGC function is operating or not.

The attenuation circuit of the Japanese Utility Model Laid-Open Publication No. HEI 7-33024 is capable of changing by 1 dB steps and controlling without noise. However, the first problem of the conventional type is that the quantity of the data to be memorized in the memory becomes large. The reason why this problem exists is that the gain control voltage data of the AGC amplifier for the transmitting or receiving level must to be memorized for the respective state of on/off of the attenuator.

The second problem is that the bit numbers of the address designating the data memorized in the memory increases and the address designating operation becomes complicated. The reason of the complication is that the construction of the address is constituted of not only the transmitting level or the receiving level but also the additional information expressing the state of "on" and "off" of the attenuator.

SUMMARY OF THE INVENTION

It is therefore an object of the present invention to provide an AGC amplifier control circuit which is capable of decreasing the quantity of the data to be memorized in the memory and simplifying the address designating the memorized data.

To achieve this object, the AGC amplifier control circuit of the present invention provides a RF attenuator, a digital/analog converter converting control voltage data to analog voltage, an AGC amplifier making gain change by the output value of said digital/analog converter, an attenuator controller controlling said RF attenuator in hysteresis and outputting the information whether said RF attenuator is driven and has a fixed attenuation quantity or not at the next gain renewing time of said AGC amplifier, a memory memorizing the control voltage data of the gain of said AGC amplifier with the relation of a desired output and a data conversion circuit provided in front of said memory. And said data conversion circuit converts the data to make the gain of said AGC amplifier increase corresponding to said attenuation quantity at the time when said RF attenuator is driven and has a fixed attenuation quantity.

Said AGC amplifier control circuit is constituted of a transmitter and a receiver, said memory is provided in both said transmitter and said receiver respectively, and the memory of said transmitter memorizes the control voltage data of the required gain of said AGC amplifier to output the desired output and the memory of said receiver memorizes the control voltage data of the required gain of said AGC amplifier to adjust the antenna input to the desired level.

Moreover, said RF attenuator changes in multi-step, said data conversion circuit memorizes plural attenuation quantities of said RF attenuator and said attenuator controller outputs the parameter how many attenuation quantity said RF attenuator has at the next gain renewing time of said AGC amplifier to said data conversion circuit.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
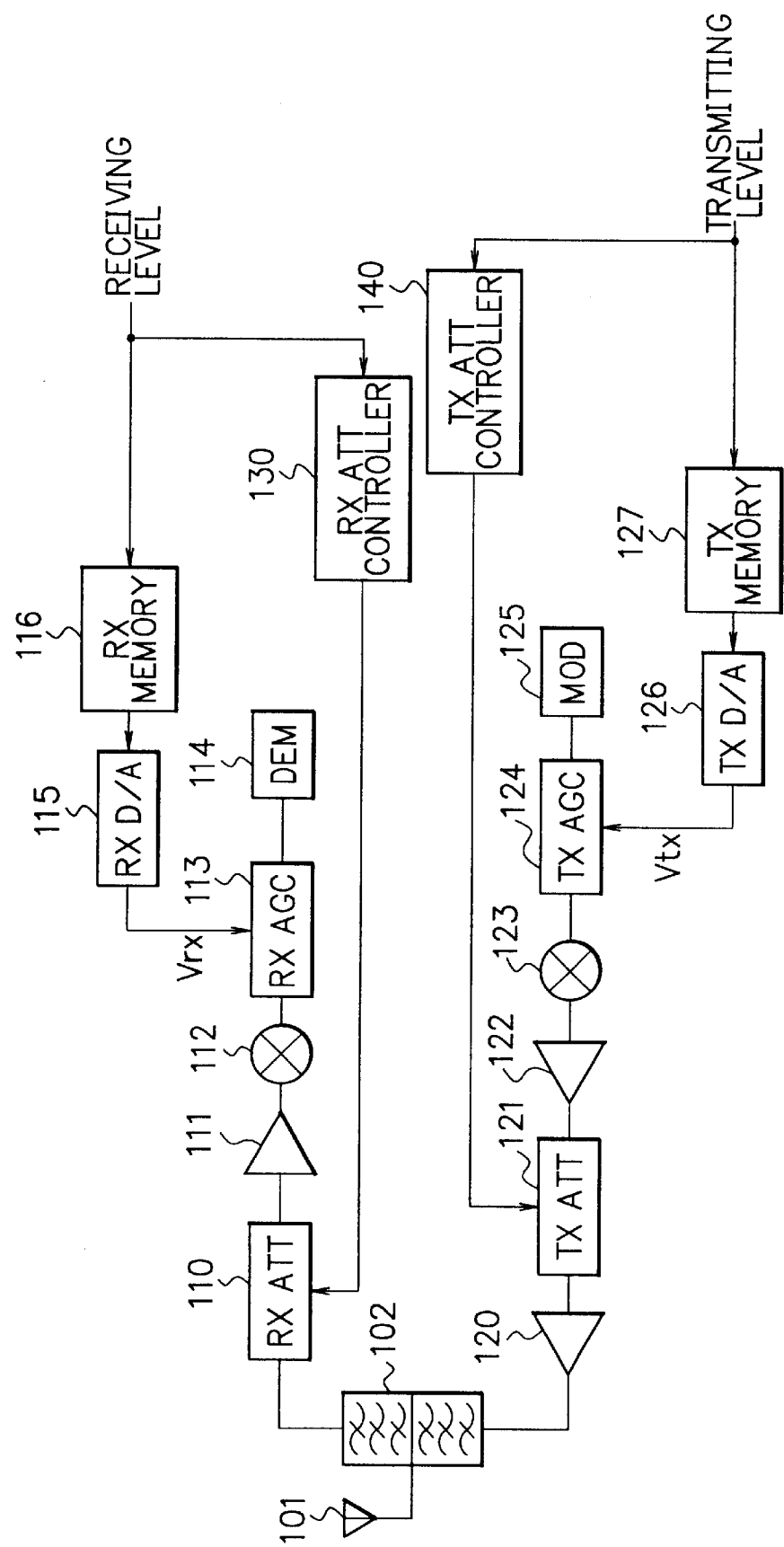
FIG. 1 is a block diagram showing an example of the construction of an AGC amplifier control circuit of the conventional type.
Figure 2:
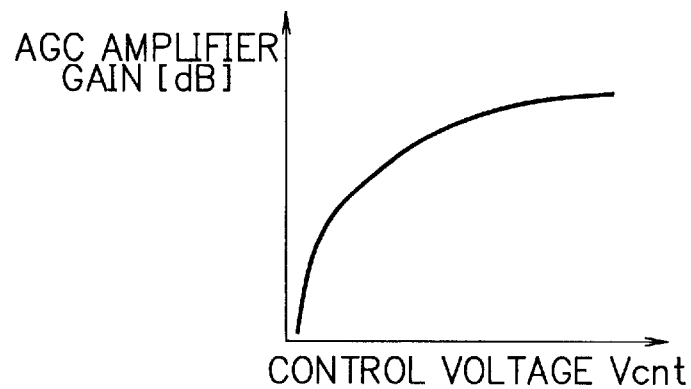
FIG. 2 is a diagram showing an example of the gain characteristic of the AGC amplifier of the conventional type.
Figure 3:
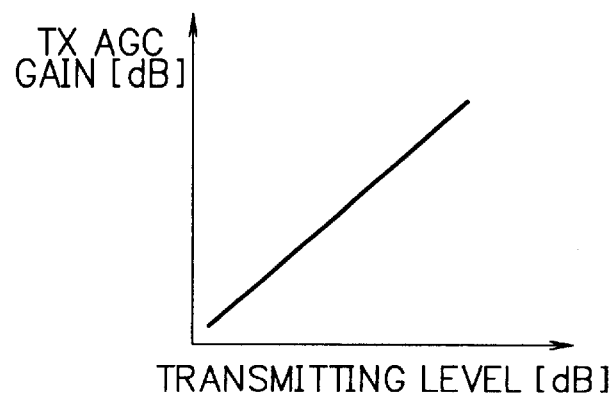
FIG. 3 is a diagram showing the gain characteristic of the conventional transmitting AGC amplifier.
Figure 4:
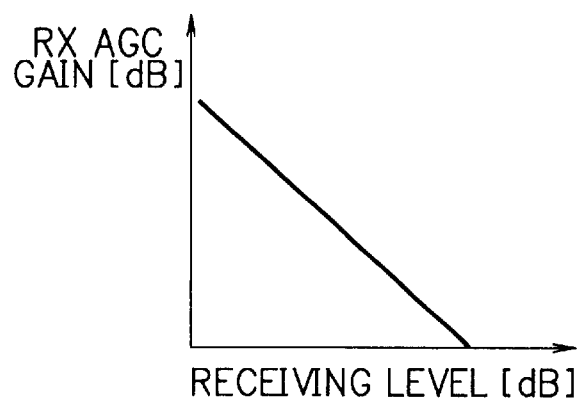
FIG. 4 is a diagram showing the gain characteristic of the conventional receiving AGC amplifier.
Figure 5:
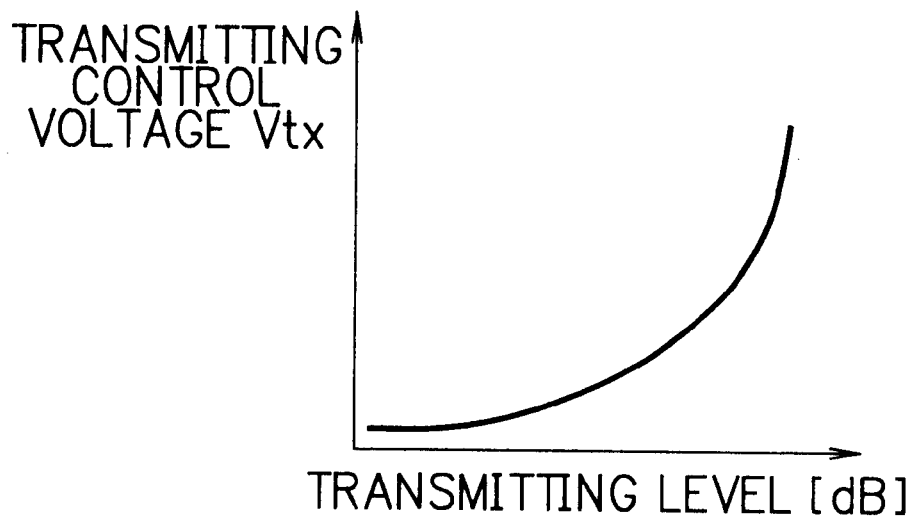
FIG. 5 is a diagram showing an example of the characteristic of the transmitting control voltage of the conventional type.
Figure 6:
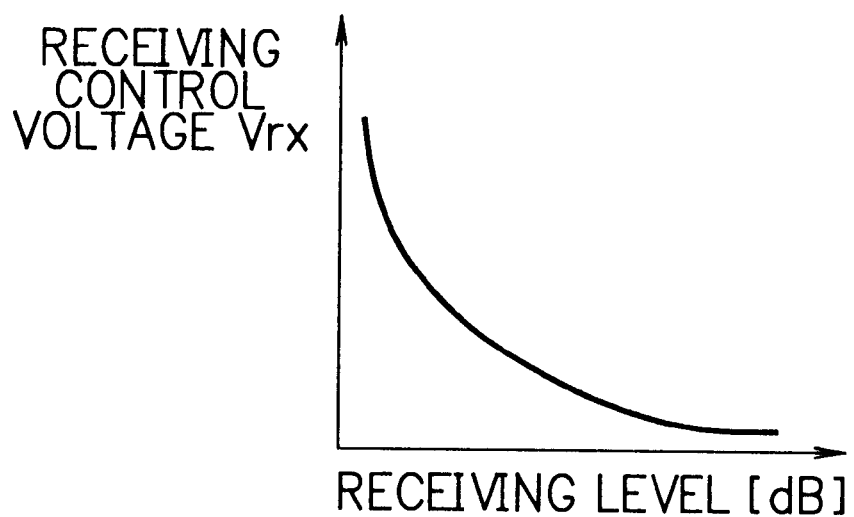
FIG. 6 is a diagram showing an example of the characteristic of the receiving control voltage of the conventional type.
Figure 7:
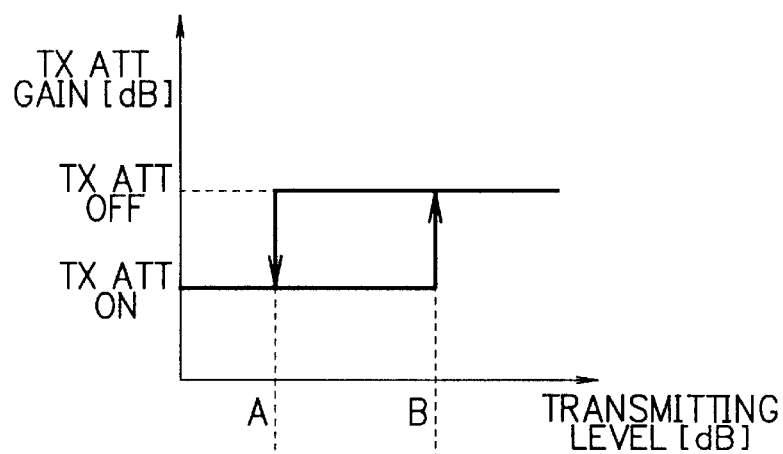
FIG. 7 is a diagram showing the data conversion of a transmitter of the present invention.
Figure 7:
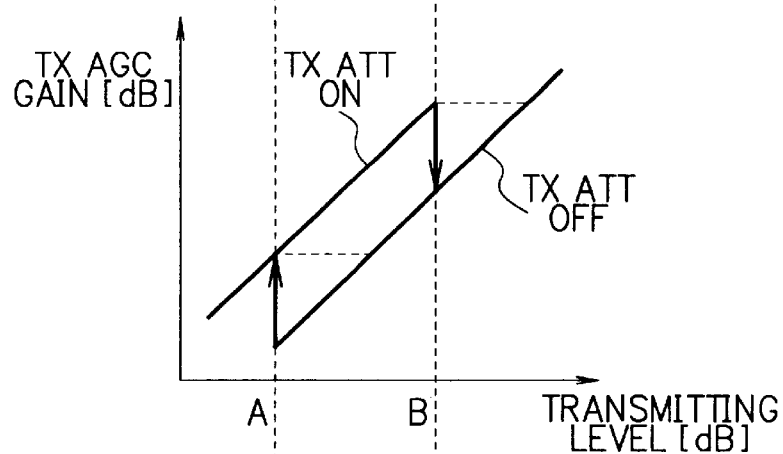
Figure 7:
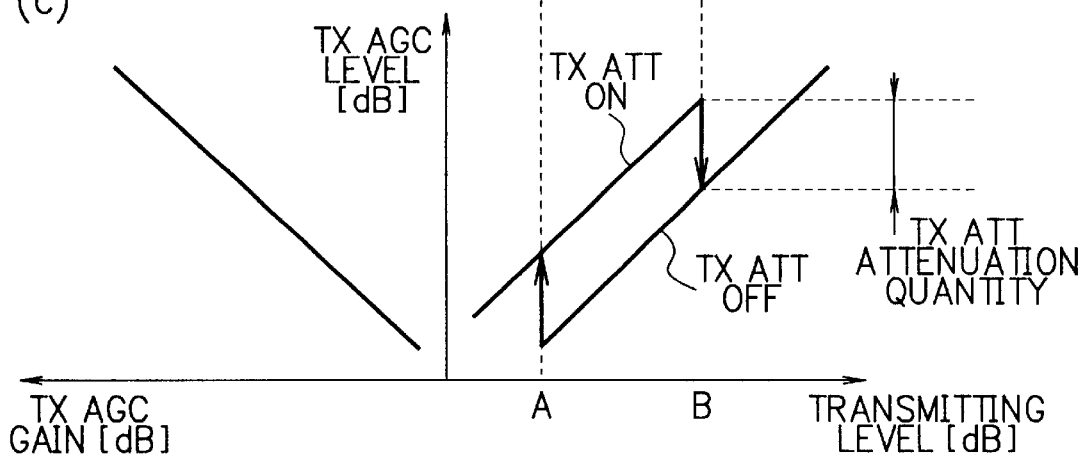
Figure 8:
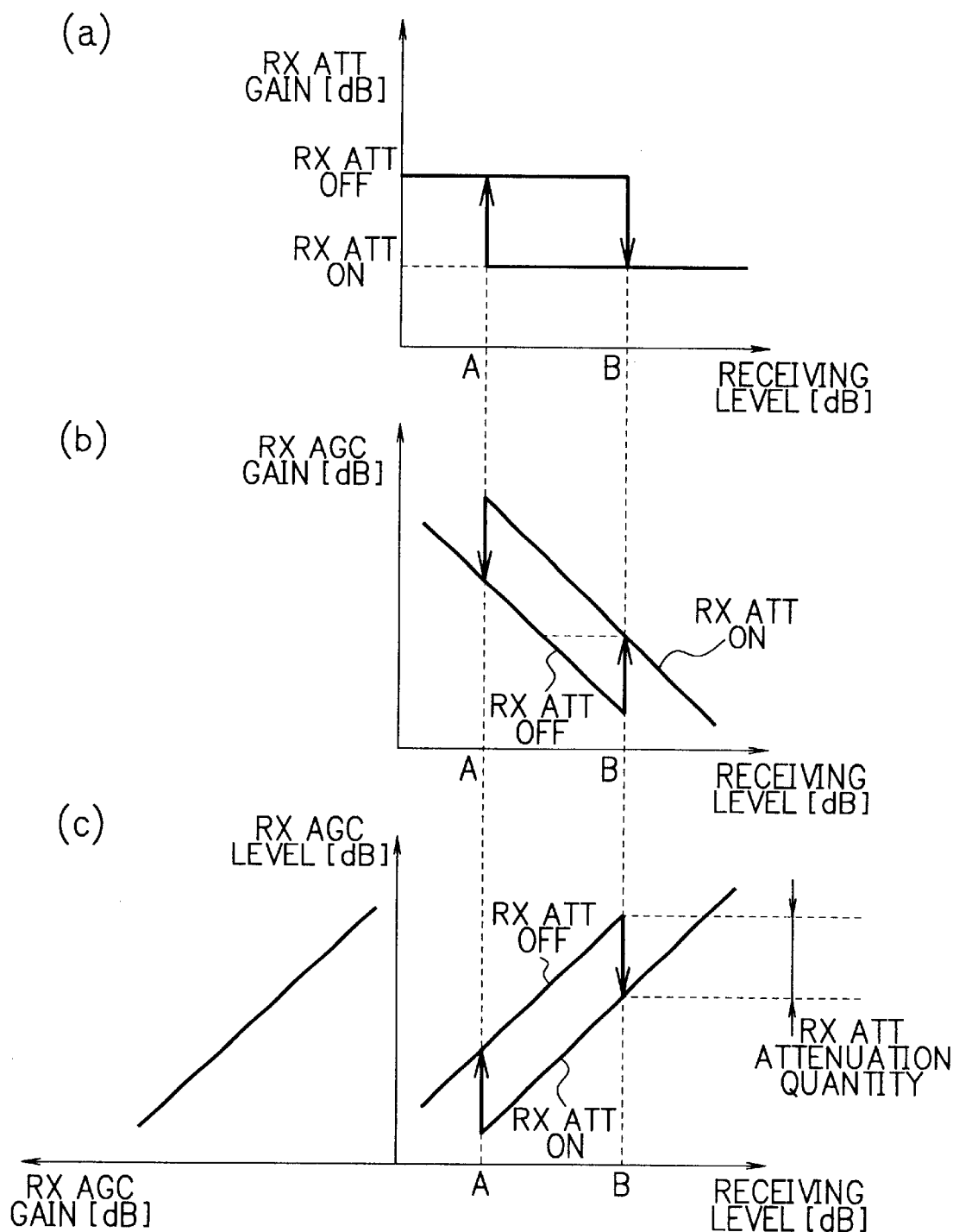
FIG. 8 is a diagram showing the data conversion of a receiver of the present invention.
Figure 9:
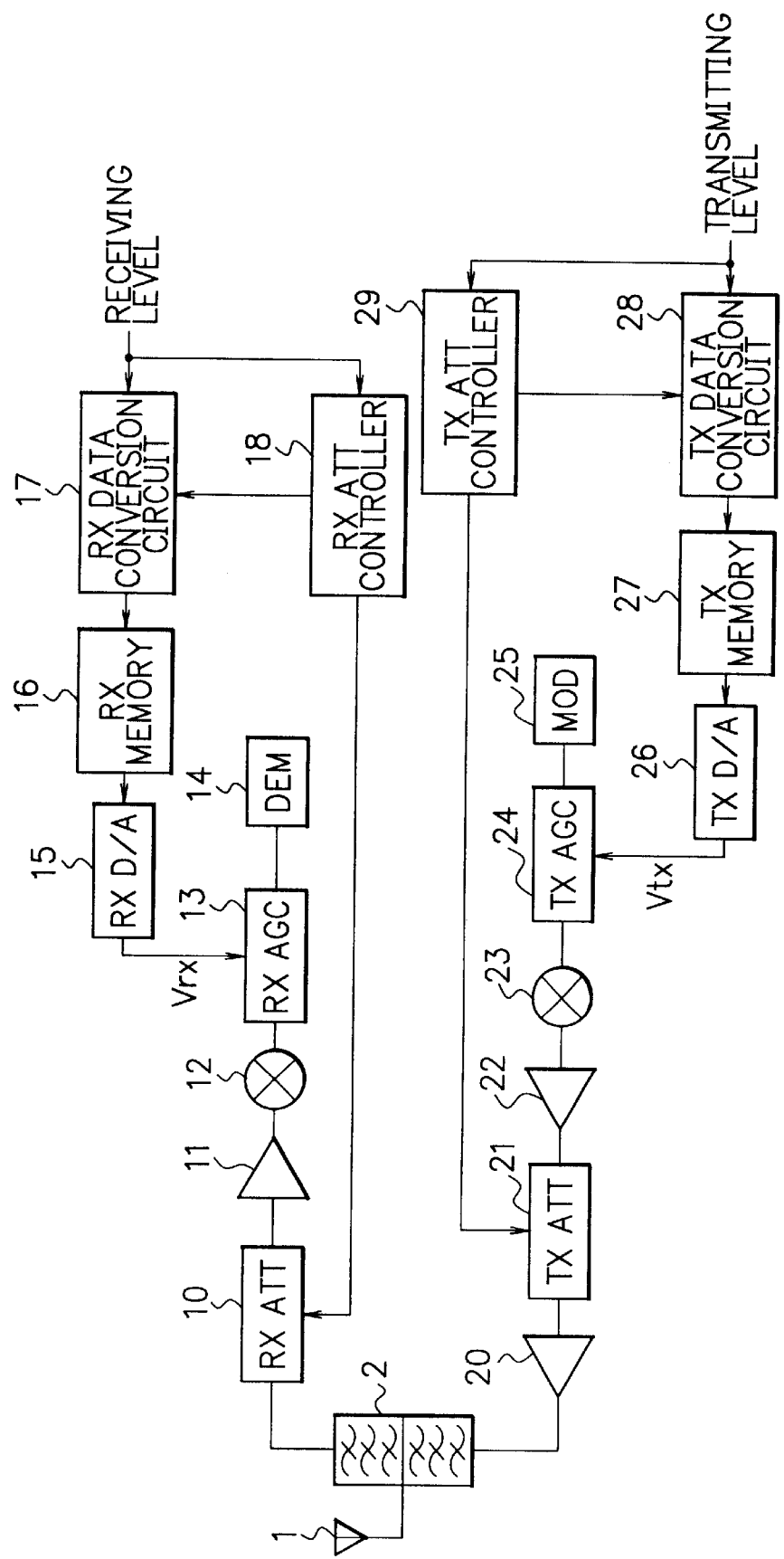
FIG. 9 is a block diagram showing an example of an embodiment of the AGC amplifier control circuit of the present invention.

Referring now to the drawings, description will be given in detail of embodiments of an AGC amplifier control circuit of the present invention. In FIGS. 7, 8 and 9, an embodiment of the AGC amplifier control circuit of the present invention is shown. FIG. 9 is a block diagram showing an example of the AGC amplifier control circuit of the present invention.

A first embodiment of the present invention is explained. In FIG. 9, a transmitting attenuator TX ATT 21 and a receiving attenuator RX ATT 10 are step attenuators providing a selective function whether makes the radio frequency RF signals pass through as they are (the state of off) or makes them attenuate only a fixed quantity (the state of on). A TX ATT controller 29 and a RX ATT controller 18 control the attenuation characteristics of the TX ATT 21 and the RX ATT 10 to be in hysteresis for the transmitting level or the receiving level respectively. At the time when the gain of a transmitting AGC amplifier TX AGC 24 or a receiving AGC amplifier 13 is renewed, the TX ATT controller 29 and the RX ATT controller 18 output the information whether the TX ATT 21 and the RX ATT 10 become the state of "on" or "off" respectively to a TX data conversion circuit 28 and a RX data conversion circuit 17.

The transmitting AGC amplifier TX AGC 24 and the receiving AGC amplifier RX AGC 13 adjust the gain of the transmitting or receiving intermediate frequency IF signal power. At the case that the TX ATT 21 is in the "on" state and has a certain quantity of attenuation, the TX data conversion circuit 28 adds a corresponding level to the attenuation quantity for the transmitting level and converts the data and then generates the TX AGC level. At the case that the RX ATT 10 is in the "on" state and has a certain quantity of attenuation, the RX data conversion circuit 17 subtracts a corresponding level to the attenuation quantity from the receiving level and converts the data and then generates the RX AGC level.

The attenuation quantity data of the TX data conversion circuit 28 and the RX data conversion circuit 17 are memorized beforehand or given from the outside circuit such as CPU at the initial setting time of the circuit. A TX memory 27 memorizes the control voltage data of the transmitting AGC amplifier corresponding to the transmitting level when the transmitting attenuator does not have the attenuation quantity. A RX memory 16 memorizes the control voltage data of the receiving AGC amplifier corresponding to the receiving level when the receiving attenuator does not have the attenuation quantity. A transmitting digital to analog converter TX D/A 26 converts the control voltage data of the transmitting AGC amplifier to the analog voltage and outputs and controls the gain of the TX AGC 24. A receiving digital to analog converter RX D/A 15 converts the control voltage data of the receiving AGC amplifier to the analog voltage and outputs and controls the gain of the RX AGC 13.

Next, referring to the drawings, the operation of the AGC amplifier control circuit of the present invention is explained in detail. First, a transmitter is explained. The TX ATT controller 29 controls the TX ATT 21 in hysteresis for the transmitting level as shown in FIG. 7 (a). The TX ATT 21 is in the state of "off" and at the time when the transmitting level becomes smaller than the point "A", the TX ATT 21 turns to the state of "on"and from this state by the transmitting level becomes larger than the point "B", the TX ATT 21 becomes again the state of "off" and the RF signals are not attenuated and passed through. At the points "A" and "B" at which the TX ATT 21 turns to "on" and "off", not to change the transmitting level at the terminal of the antenna discontinuously, the TX AGC 24 must change the gain to the reverse direction by the same attenuation quantity of the TX ATT 21.

FIG. 7 (b) shows the relation between the gain of the TX AGC 24 required by the transmitting level and the transmitting level. The unit of the transmitting level and the TX AGC 24 is "dB" and the control voltage data is generated to make the gradient "1". Therefore, the change of the transmitting level corresponds to the change of the gain of the TX AGC 24 by one to one. The straight line at the time when the TX ATT 21 is in the state of "off" is determined as the standard characteristic. At the case that the transmitting level is at the point "A" and the TX ATT 21 is turned from "off" to "on", when the attenuation quantity of the TX ATT 21 is added to the transmitting level of the TX standard characteristic and shifted to a right direction, the desired gain is obtained. During the TX ATT 21 is in the state of "on", the value that the attenuation quantity of the TX ATT 21 is added to the transmitting level is determined as the TX AGC level.

At the time when the transmitting level becomes at the point "B" in the TX ATT 21 being in the state "on", the TX AGC level takes a larger value than the point "B" by the attenuated quantity in the TX standard characteristic. At the case that the TX ATT 21 turns from "on" to "off" in the transmitting level being at the point "B", in the TX standard characteristic, the added attenuation quantity is subtracted from the TX AGC level and makes the TX AGC level the same value of the transmitting level and then the desired gain is obtained. At the TX data conversion circuit 28, at the case that the TX ATT 21 is in the state of "on" the attenuation quantity is added to the transmitting level, in the state of "off" the transmitting level remains as it is, and the TX AGC level is generated and outputted.

In FIG. 7 (b), using TX AGC level instead of the transmitting level, only by memorizing the characteristic when the TX ATT 21 is in the state "off", the control at the time of the TX ATT being in the state "on" is also possible. FIG. 7 (c) shows the relation between the transmitting level and the TX AGC level and also the relation between the TX AGC level and the TX AGC gain. In the TX memory 27, the transmitting control voltage data between the transmitting level when the TX ATT 21 is in the state "off" and the gain characteristic of the TX AGC 24 are memorized, as the address the TX AGC level instead of the transmitting level is used. With this, considering the state of "on" and "off" of the TX ATT 21, the desired gain of the TX AGC 24 is able to be obtained.

Next, the receiver is explained. The RX ATT controller 18 controls the RX ATT 10 in hysteresis for the receiving level as shown in FIG. 8 (a). At the time when the RX ATT 10 is in the state of "off" and the receiving revel becomes larger than the point "B", the RX ATT 10 becomes the state of"on". From this state by the receiving level becomes smaller than the point "A", the RX ATT 10 becomes again the state of "off" and the RF signals are passed through without attenuated. At the points "A" or "B" where the RX ATT 10 turns off or on, not to be changed the input level of a demodulator DEM 14 discontinuously, the gain of the RX AGC 13 must be changed to the reverse direction by the same attenuation quantity of the RX ATT 10.

FIG. 8 (b) shows the relation between the required gain of the RX AGC 13 for the receiving level and the receiving level. The unit of the receiving level and the gain of the RX AGC 13 is "dB" and the control voltage data are generated to be the gradient "–1". Therefore, the gain change of the RX AGC 13 for the change of the receiving level changes one to one in the reverse direction of sign. The straight line when the RX ATT 10 is in the state of "off" is determined as the RX standard characteristic. At the case that the receiving level is at the point "B" and the RX ATT 10 turns from "off" to "on", by subtracting the attenuation quantity of the RX ATT 10 from the receiving level of the RX standard characteristic and shifting to the left, the desired gain is able to be obtained.

During the RX ATT 10 is in the state of "on", the value subtracting the attenuation quantity of the RX ATT 10 from the receiving level is determined as the RX AGC level. At the time when the receiving level becomes at the point "A" in the RX ATT 10 being in the state of "on", in the RX standard characteristic, the RX AGC level takes a value which is smaller than the point "A" by the attenuation quantity. At the case that the receiving level is at the point "A" and the RX ATT 10 turns from on to off, in the RX standard characteristic, taking out from the RX AGC level the attenuation quantity which is subtracted before and making the same as the receiving level, a required gain is able to be obtained. In the RX data conversion circuit 17, at the case that the RX ATT 10 is in the state of "on" the attenuation quantity is subtracted from the receiving level, and at the case that the RX ATT 10 is in the state of "off" by making the receiving level as it is, the RX AGC level is generated and outputted.

In FIG. 8 (b), using the RX AGC level instead of the receiving level, by only memorizing the characteristic when the RX ATT 10 is in the state of"off", the control when the RX ATT 10 being in the state of "on" is also possible. FIG. 8 (c) shows the relation between the receiving level and the RX AGC level, and the relation between the RX AGC level and the RX AGC gain. In the RX memory 16, the receiving control voltage data between the receiving level and the gain characteristic of the RX AGC 13 at the time the RX ATT 10 being the state of "off" are memorized, the RX AGC level instead of the receiving level is used as the address. With this, by considering the states of "on" and "off" of the RX ATT 10, the desired gain of the RX AGC 13 is able to be obtained.

According to the first embodiment of the present invention, the transmitting or receiving level is corresponded to the on or off state of the attenuator, the data conversion is implemented by considering the attenuation quantity of the attenuator. Therefore the data to be memorized to the memory are only the control voltage data of the case that the attenuator is in the state of "off" and only the small data capacity is enough.

The TX AGC level or the RX AGC level converted the transmitting or receiving level to the data conversion includes the on/off information of the attenuator. Therefore it is not necessary to add the on/off information of the attenuator to the address of the memory and then the number of bits does not increase.

Next, a second embodiment of the present invention is explained. The above mentioned transmitter and receiver are explained using a one-step step attenuator as an attenuator, however a multi-step step attenuator is also usable. In this case, in the TX data conversion circuit 28 and the RX data conversion circuit 17, the plural attenuation quantities of the attenuator are memorized. The TX ATT controller 29 and the RX ATT controller 18, at the time when the transmitting or receiving AGC amplifier renews the gain, output parameters how many attenuation quantities the transmitting or receiving attenuator have to the TX data conversion circuit 28 or the RX data conversion circuit 17. The TX data conversion circuit 28 and the RX data conversion circuit 17, using the attenuation quantities corresponding to the given parameters, implement the data conversion for the transmitting level and the receiving level.

The second embodiment of the present invention has the effect that the attenuation quantities of the attenuator are changeable in multi-step in addition to the first embodiment of the present invention.

The above mentioned embodiments are suitable examples of the present invention. However, the present invention is not limited to these embodiments and applicable for various application in the field without deviations from the spirit of the present invention.

As clearly explained above, the AGC amplifier control circuit of the present invention memorizes the control voltage data of the gain of the AGC amplifier with the relation to a desired output in the memory, at the time when the RF attenuator is driven and has a fixed attenuation quantity, implements the data conversion by the data conversion circuit by making the gain of the AGC amplifier increase corresponding to this attenuation quantity. Therefore, to the address of the memory, the value which the transmitting level or the receiving level is converted in consideration of the attenuation quantity of the attenuator is used, with this, the data quantity memorizing in the memory are saved in a small quantity and the data quantity is able to be reduced.

In the same numbers of bits data generated after converted the transmitting or receiving level, the on/off information of the attenuator is included, therefore the data expressing the on/off information are not needed to be added. With this, the numbers of bits of the address do not increase and it is possible to decrease the numbers of pins of the memory.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An AGC amplifier control circuit, comprising:
    a RF attenuator;
    a digital/analog converter converting control voltage data to analog voltage;
    an AGC amplifier making gain change by the output value of said digital/analog converter, wherein said AGC amplifier makes a gain change in a nonlinear manner with respect to said control voltage;
    an attenuator controller controlling said RF attenuator in hysteresis and outputting the information whether said RF attenuator is driven and has a fixed attenuation quantity or not at the next gain renewing time of said AGC amplifier;
    a memory memorizing the control voltage data of the gain of said AGC amplifier with the relation of a desired output at the time when said RF attenuator does not have an attenuation quantity, and
    a data conversion circuit provided in front of said memory,
    said data conversion circuit converts the data to make the gain of said AGC amplifier increase corresponding to said attenuation quantity at the time when said RF attenuator is driven and has a fixed attenuation quantity.

2. An AGC amplifier control circuit in accordance with claim 1, wherein:
    said AGC amplifier control circuit is constituted of a transmitter and a receiver.

3. An AGC amplifier control circuit in accordance with claim 2, wherein:
    said memory is provided in both said transmitter and said receiver respectively, and the memory of said transmitter memorizes the control voltage data of the required gain of said AGC amplifier to output the desired output and the memory of said receiver memorizes the control voltage data of the required gain of said AGC amplifier to adjust the antenna input to the desired level.

4. An AGC amplifier control circuit in accordance with claim 1, wherein:
    said RF attenuator changes in multi-step.

5. An AGC amplifier control circuit in accordance with claim 4, wherein:
    said data conversion circuit memorizes plural attenuation quantities of said RF attenuator.

6. An AGC amplifier control circuit in accordance with claim 5, wherein:
    said attenuator controller outputs the parameter how many attenuation quantity said RF attenuator has at the next gain renewing time of said AGC amplifier to said data conversion circuit.

7. An AGC amplifier control circuit in accordance with claim 4, wherein:
    said attenuator controller outputs the parameter how many attenuation quantity said RF attenuator has at the next gain renewing time of said AGC amplifier to said data conversion circuit.

* * * * *